US009379708B2

(12) United States Patent
Martin et al.

(10) Patent No.: US 9,379,708 B2
(45) Date of Patent: Jun. 28, 2016

(54) SWITCH DRIVER CIRCUIT AND ASSOCIATED METHODS

(71) Applicant: Allegro Microsystems, LLC, Worcester, MA (US)

(72) Inventors: William E. Martin, Bedford, NH (US); George P. Humphrey, Merrimack, NH (US)

(73) Assignee: Allegro Microsystems, LLC, Worcester, MA (US)

( * ) Notice: Subject to any disclaimer, the term of this patent is extended or adjusted under 35 U.S.C. 154(b) by 0 days.

(21) Appl. No.: 14/677,029

(22) Filed: Apr. 2, 2015

(65) Prior Publication Data
US 2016/0049939 A1 Feb. 18, 2016

Related U.S. Application Data

(60) Provisional application No. 62/037,838, filed on Aug. 15, 2014.

(51) Int. Cl.
*H03K 19/017* (2006.01)
*H03K 19/0175* (2006.01)
*H03K 19/0185* (2006.01)
*H05B 33/08* (2006.01)

(52) U.S. Cl.
CPC .................. *H03K 19/017545* (2013.01); *H03K 19/018507* (2013.01); *H05B 33/0815* (2013.01); *H05B 33/0845* (2013.01)

(58) Field of Classification Search
CPC ............... H03K 19/017545; H03K 19/018507
See application file for complete search history.

(56) References Cited

U.S. PATENT DOCUMENTS

| 4,540,893 | A | 9/1985 | Bloomer |
| 5,594,369 | A | 1/1997 | Kondoh et al. |
| 5,668,449 | A | 9/1997 | Carobolante |
| 5,670,894 | A | 9/1997 | Takaishi et al. |
| 6,208,177 | B1 * | 3/2001 | Knoedl, Jr. ........... H03K 17/167 327/108 |
| 6,396,250 | B1 | 5/2002 | Bridge |
| 6,411,120 | B1 * | 6/2002 | Hung ................ H03K 19/00361 326/27 |
| 6,448,807 | B1 * | 9/2002 | Ahsanullah .......... H03K 17/164 326/26 |
| 6,650,153 | B2 * | 11/2003 | Zerilli .................. H03K 17/163 327/134 |
| 6,664,822 | B2 | 12/2003 | Watabe |
| 7,737,666 | B2 | 6/2010 | Sutardja et al. |

(Continued)

FOREIGN PATENT DOCUMENTS

DE   10 2007 009 734   6/2008
JP       2003125574     4/2003

OTHER PUBLICATIONS

Application as filed on Feb. 12, 2015 for U.S. Appl. No. 14/620,656; 26 pages.

(Continued)

*Primary Examiner* — Douglas W Owens
*Assistant Examiner* — Pedro C Fernandez
(74) *Attorney, Agent, or Firm* — Daly, Crowley, Mofford & Durkee, LLP

(57) ABSTRACT

A driver circuit for driving a switch includes a high output impedance driver circuit portion having a high impedance output node coupled to the control terminal of the transistor and a low output impedance driver circuit portion having a low impedance output node also coupled to the control terminal of the transistor. The slew rate of the control signal is established by at least one of the high impedance driver circuit portion and the low impedance driver circuit portion.

4 Claims, 3 Drawing Sheets

(56) References Cited

U.S. PATENT DOCUMENTS

| | | | |
|---|---|---|---|
| 7,936,189 B2 | 5/2011 | Tumminaro et al. | |
| 8,692,482 B2 | 4/2014 | Szczeszynski et al. | |
| 8,773,172 B2 | 7/2014 | Bayerer | |
| 8,779,805 B1 | 7/2014 | Fernandez et al. | |
| 8,957,715 B2 | 2/2015 | Eagen | |
| 2002/0153928 A1 | 10/2002 | Zerilli et al. | |
| 2006/0267861 A1* | 11/2006 | Yonezawa | H05B 33/0803 345/46 |
| 2010/0156505 A1 | 6/2010 | Strzalkowski | |
| 2014/0253186 A1* | 9/2014 | De Geeter | H03K 17/6871 327/110 |

OTHER PUBLICATIONS

Application as filed on Nov. 26, 2014 for U.S. Appl. No. 14/554,396; 35 pages.
U.S. Appl. No. 14/620,656; 174 pages.
Search Report and Written Opinion dated Mar. 31, 2014 for PCT Application No. PCT/US2013/071165 11 pages.
Article 19 Amendment dated May 12, 2014 for PCT Application No. PCT/US2013/071165 10 pages.
Article 19 Amendment filed Jun. 13, 2014 for PCT Application No. PCT/US2013/071165; 10 pages.
Notice of Allowance dated Jan. 15, 2016 for U.S. Appl. No. 14/554,396; 10 pages.
PCT International Preliminary Report on Patentability and Written Opinion of the ISA dated Jul. 9, 2015; for PCT Pat. App. No. PCT/US2013/071165; 8 pages.
Search Report and Written Opinion dated Jan. 28, 2016 for PCT Application No. PCT/US2015/057920; 10 pages.
US 6441120, Jun. 2002, Hung et al. (withdrawn).
U.S. Appl. No. 62/037,838, filed Aug. 15, 2014, Martin et al.
U.S. Appl. No. 14/798,912, filed Jul. 14, 2015, Wibben.
Advanced Power Technology Application Note APT0102; "Optimizing MOSFET and IGBT Gate Current to Minimize dv/dt Induced Failures in SMPS Circuits", Oct. 29, 2001, 6 pages.
Allegro Microsystems, LLC Data Sheet A4911; "Automotive Three Phase MOSFET Driver;" May 22, 2015; pp. 1-60.
Allegro Microsystems, LLC Data Sheet A4933; "Automotive 3-Phase MOSFET Driver;" Jan. 2010; 25 pages.
Allegro Microsystems, LLC Data Sheet A8660; "Synchronous Buck Controller with Low Operating Current;" May 20, 2015; 30 pages.
STMicroelectronics Data Sheet L99DZ80EP; "Door Actuator Driver;" Sep. 2013; 68 pages.
Office Action dated May 6, 2016 for U.S. Appl. No. 14/798,912, 8 pages.

* cited by examiner

SWITCH DRIVER CIRCUIT AND ASSOCIATED METHODS

CROSS REFERENCE TO RELATED APPLICATIONS

This application claims the benefit of U.S. Provisional Application No. 62/037,838 filed Aug. 15, 2014 and entitled "Switch Driver Circuit and Associated Methods" which application is incorporated herein by reference in its entirety.

STATEMENT REGARDING FEDERALLY SPONSORED RESEARCH

Not Applicable.

FIELD

This disclosure relates generally to transistor driver circuits and, more particularly, to a transistor driver circuit with a variable slew rate.

BACKGROUND

Switching elements, such as Field Effect Transistors (FETs), are used in a variety of applications to drive various types of loads. As one example, FETs are used to drive LED loads such that when the FET conducts, current passes through the LED (or string of series-coupled LEDs or parallel such strings) to illuminate the LED load. The particular level of current through the LED can control the LED turn on/turn off and/or brightness.

Driver circuits for driving a switching element such as a FET generally provide a control signal to a control terminal of the FET (e.g., the gate terminal) which causes the FET to conduct when the control signal reaches a predetermined voltage level, as may be referred to as a conduction threshold voltage level ($V_T$), associated with the FET. An illustrative control signal ramps up at a predetermined slew rate when the system demands that the FET turn on to provide current to the load, remains at a substantially constant, predetermined level to maintain the FET in a conductive state, and then ramps down at a predetermined slew rate to turn off the FET and cease the flow of current to the load.

The turn on and turn off time intervals and characteristics of the FET can be affected by a parasitic capacitance of the FET between the gate and source terminals ($C_{GS}$). In particular, it can take longer than otherwise possible to turn on a FET with a relatively large $C_{GS}$ since the control signal will charge the capacitance $C_{GS}$ causing it to take longer for the control signal to reach the conduction threshold. Additionally, it can take longer than otherwise possible to turn on a FET with a relatively high threshold voltage $V_T$ since the control signal must be ramped up through a larger voltage range. While these considerations suggest that it is desirable to speed up the slew rate at which the FET control signal is ramped up, stability issues can arise when a FET is switched on and/or off too fast. Additionally, fast switching of the FET can cause or exacerbate electromagnetic interference. Certain compliance standards, such as certain FCC standards or automotive standards, require electromagnetic emissions to be within certain levels.

SUMMARY

A driver circuit for driving a transistor having a control terminal responsive to a control signal having a slew rate during a slew time interval includes a first driver circuit portion having an first output node coupled to the control terminal of the transistor and having a first output impedance and a second driver circuit portion having a second output node coupled to the control terminal of the transistor and having a second output impedance, lower than the first output impedance. The slew rate of the control signal is established by at least one of the first driver circuit portion and the second driver circuit portion.

Features may include one or more of the following. The first driver circuit portion may have a first input responsive to a feedback signal, a second input responsive to a reference signal, and generate an output signal at the first output node. The first driver circuit portion may include a differential amplifier responsive to the feedback signal and the reference signal and a current mirror coupled to an output of the differential amplifier. In one embodiment, the differential amplifier can be operational transconductance amplifier. The second driver circuit portion may include a pre-driver circuit coupled to the first driver circuit portion and a transistor having a control terminal and an output terminal, wherein the control terminal of the transistor is responsive to the pre-driver circuit and the output terminal of the transistor provides the second output node. The transistor may be a bipolar transistor. The second driver circuit portion may include a switch configured to be in a first position to enable the pre-driver circuit or in a second position to disable the pre-driver circuit. In an embodiment, the slew rate of the control signal is established by the first driver circuit portion and the second driver circuit portion during a first portion of the slew time interval and the slew rate of the control signal is not established by the second driver circuit portion during a second portion of the slew time interval, following the first portion of the slew time interval. Also described is an LED driver circuit including a switching device for driving an LED load and the above-described driver circuit for generating the control signal.

According to another aspect, a method for controlling a switching device responsive to a control signal for driving a load includes providing a first driver circuit portion having a first output node with a first output impedance and providing a second driver circuit portion having a second output node with a second output impedance, lower than the first output impedance. The second output node is coupled to the first output node and the control signal is provided at the coupling of the first output node and the second output node. The method further includes ramping the level of the control signal at a slew rate established by at least one of the first output impedance and the second output impedance.

The control signal may be ramped up at a first slew rate established by the first output impedance and the second output impedance during a first time interval and may be ramped tip at a second slew rate that is not established by the second output impedance during a second time interval following the first time interval. The method may include enabling the second driver circuit portion during the first time interval and disabling the second driver circuit portion during the second time interval. In an embodiment, the control signal may be ramped up at a slew rate established by the first output impedance and the second impedance and may be ramped down at a slew rate that is not established by the second output impedance.

With the described driver circuitry and techniques, the transistor control signal has a variable slew rate that turns on the transistor with a desired characteristic without sacrificing stability.

BRIEF DESCRIPTION OF THE DRAWINGS

The foregoing features of the disclosure, as well as the disclosure itself may be more fully understood from the following detailed description of the drawings, in which.

DETAILED DESCRIPTION

Figure 1:
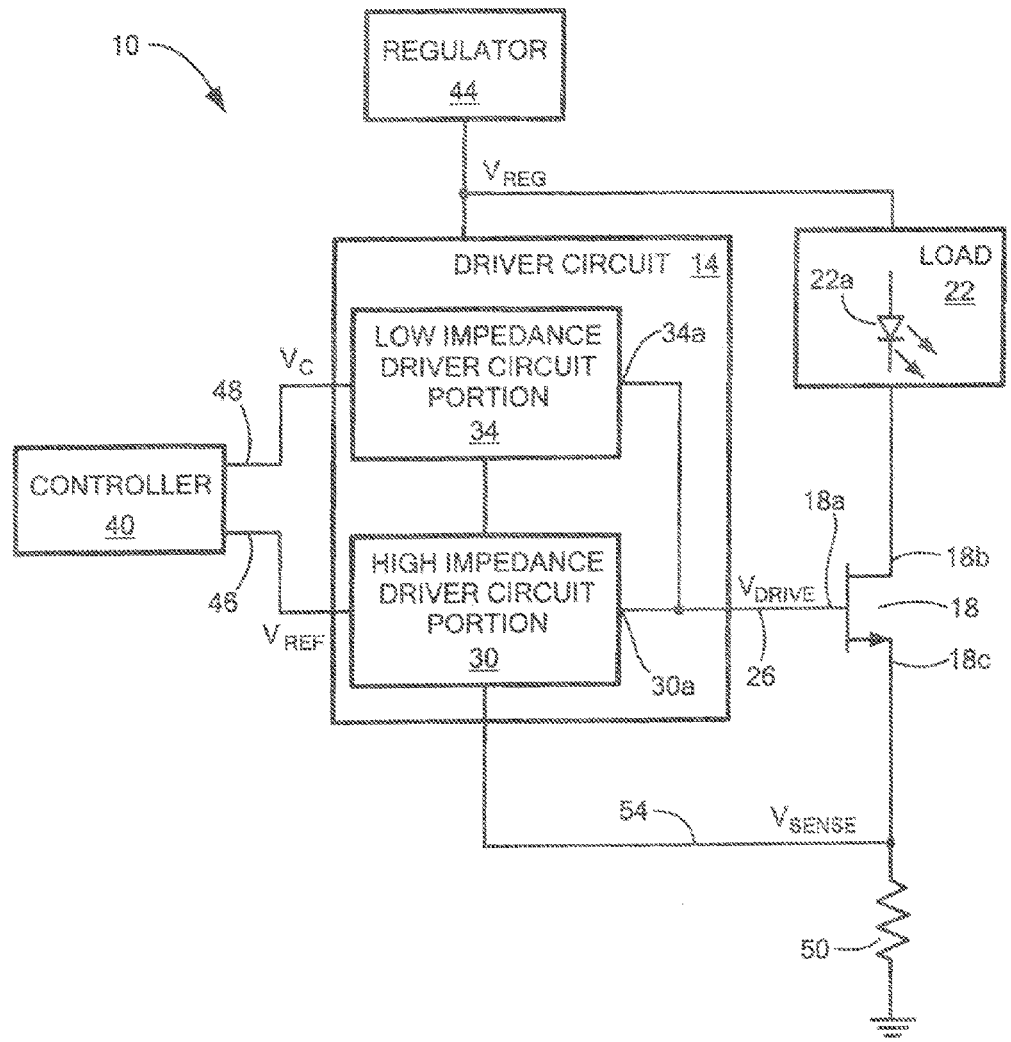
FIG. 1 is a block diagram of an electronic system for driving a switch including a driver circuit configured to provide a control signal with a variable slew rate.

Referring to FIG. 1, an electronic circuit 10 includes a driver circuit 14 for driving a switching device 18 coupled to a load 22. The switching device 18 has a control terminal 18a responsive to a control signal $V_{DRIVE}$ 26 having a slew rate during a slew time interval. The driver circuit 14 includes a first, high impedance, driver circuit portion 30 having a first output node 30a coupled to the control terminal of the transistor and having a first output impedance, and a second, low impedance, driver circuit portion 34 having a second output node 34a coupled to the control terminal of the transistor and having a second output impedance, lower than the first output impedance. The slew rate of the control signal 26 is established by at least one of the first driver circuit portion 30 and the second driver circuit portion 34. With this arrangement, the control signal 26 can be provided with a faster slew rate than otherwise possible when necessary to turn the switch 18 on and/or off as required by the load 22.

The switching device 18 is shown as an n-channel FET, the control terminal 18a is a gate terminal of the FET, and the control signal 26 is a voltage signal at the gate of the FET. When the control signal 26 at the control terminal 18a crosses a conduction threshold $V_T$ of the switching device 18 in one direction (e.g. crosses from low to high), the switching device may turn on (i.e. conduct). If the control signal 26 crosses the conduction threshold in the opposite direction (e.g. crosses from high to low), the switching device 18 may turn off (i.e. stop conducting). A drain terminal 18b of the FET 18 is coupled to the load 22 and a source terminal 18c is coupled to a sense resistor 50. However, the switching device 18 can be any type of switching device that can be controlled through a control terminal. For example, the switching device can be an n-channel or p-channel FET, a logic gate, a BJT, a relay, etc. In an embodiment, the switching device may comprise multiple switching devices. For example, the switching device may include multiple FETs, logic gates, BJT, relays, etc, arranged in parallel or in series, or a combination thereof. In such an embodiment, the multiple switching devices may be controlled by a single control signal 26. Alternatively, the control signal 26 may comprise multiple control signals each controlling one or more switching devices.

The control signal 26 coupled to the control terminal 18a may be a voltage signal, a current signal, or any other type of signal that can control the switching device 18. Note that if the switching device 18 is a relay, the control signal may be a pulsed signal, such as a PWM signal, that can cause the relay to open or close relatively slowly.

The load 22 can be any type of circuit, device, or element. In an embodiment, the load 22 is an LED 22a configured to turn on and off and/or to change brightness when the switch 18 conducts. Such an LED load can take various forms, such as a single LED, a string of series-coupled LEDs, parallel-coupled LEDs, and/or parallel strings of series-coupled LEDs. In one application, the load 22 is an LED load used in a lighting unit, such as in an automobile.

The control signal 26 can be generated in various ways to meet the requirements of the load 22. In the illustrative electronic circuit 10, a controller 40 generates a reference signal $V_{REF}$ 46 that is indicative of a desired turn on and turn of characteristic of the FET 18. For example, the slew rates at which the reference signal 46 ramps up and/or down can be selected to achieve a particular noise level specification.

As will be described, the high impedance driver circuit portion 30 is responsive to the reference signal 46 for generating the switch control signal 26. The controller 40 additionally generates a low impedance enable signal $V_C$ 48 that controls the low impedance driver circuit portion 34 as will also be described. As one example, the controller 40 can be an engine control unit (ECU) of an automobile in an electronic circuit 10 where the load 22 is an automotive lighting unit.

A regulator 44 provides a regulated voltage $V_{REG}$ to the driver circuit 14 and to the load 22 and may take any form, such as a linear regulator or a switching regulator. A sense resistor 50 is coupled in series with the switching device 18 and a feedback signal $V_{SENSE}$ 54 is coupled between the sense resistor 50 and the driver circuit 14, as shown. It will be appreciated that in some embodiments, the switching device 18 can be coupled in series between the regulator and the load.

The switching device 18 is shown as being separate from (i.e., external to) the driver circuit 14. However, it will be appreciated that the switching device 18 may be part of the driver circuit. Likewise, the regulator 44 may also, or alternatively be part of the driver circuit. Furthermore, the driver circuit 14 may be implemented in the form of an integrated circuit in some embodiments.

Figure 2:
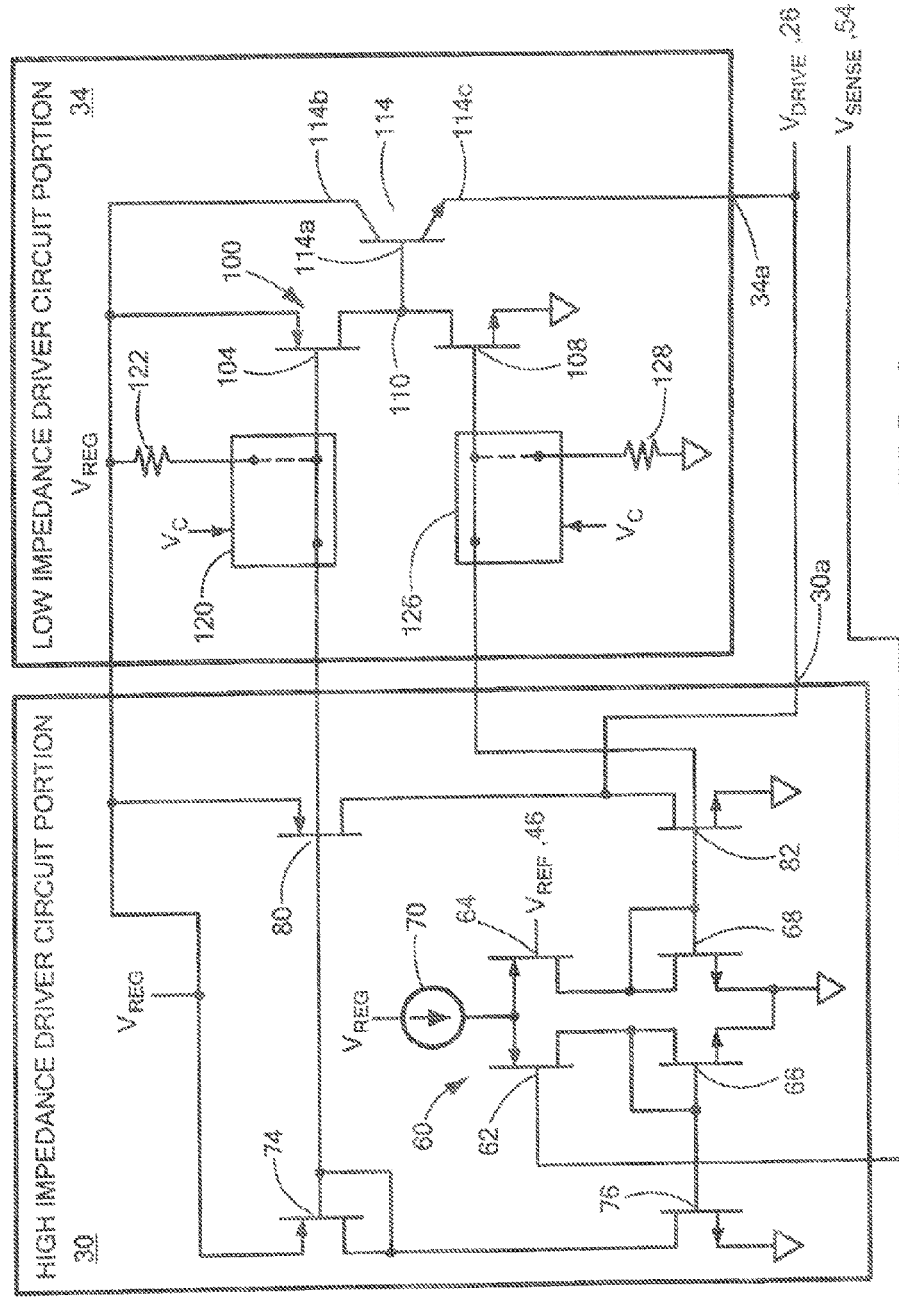
FIG. 2 is a schematic of a portion of the driver circuit of FIG. 1.

Referring also to FIG. 2, the high impedance driver circuit portion 30 and the low impedance driver circuit portion 34 are shown. The high impedance driver circuit portion 30 is responsive to the feedback signal $V_{SENSE}$ 54 from the sense resistor 50 (FIG. 1) and to the reference signal $V_{REF}$ 46 from the controller (FIG. 1) and has an output node 30a having an output impedance. The output impedance of the high impedance driver circuit portion 30 may be on the order of hundreds of kilo ohms for example.

The illustrative high impedance driver circuit portion 30 includes a differential amplifier 60, as may take the form of an operational transconductance amplifier. The amplifier 60 includes FETs 62, 64, 66, and 68 and a current source 70 arranged as shown. The feedback signal 54 is coupled to a control terminal of FET 62 and the reference signal 46 is coupled to a control terminal of FET 64. An output current of the amplifier flows through FETs 74 and 76 and a current mirror arrangement is formed by additional FETs 80 and 82. The output node 30a of the high impedance driver circuit portion 30 is provided at the junction of FETs 80 and 82, as shown.

In operation, the amplifier 60 provides a well controlled current through transistors 74 and 76 that is indicative of a voltage difference between the feedback signal 54 and the reference signal 46. The current through FETs 74 and 76 is mirrored through FETs 80 and 82 to provide a voltage at the output node 30a that has a voltage level proportional to the difference between the feedback signal 54 and the reference signal 46.

It will be appreciated that in some electronic circuits and under some operating conditions, the voltage provided at the high impedance driver circuit portion output node 30a would suffice to turn on and off the switching device 18 in a manner sufficient to meet the requirements of the load 22. However, in other scenarios, such as where the FET 18 has a large gate to source capacitance, the load may demand a faster turn on time for the FET 18 than can be provided by the high impedance driver circuit portion 30 alone.

The low impedance driver circuit portion 34 is provided to "boost" the voltage level of the control signal 26 under conditions when the high impedance driver circuit alone cannot achieve the desired FET turn on characteristics. The low impedance driver circuit portion 34 is responsive to the low impedance enable signal $V_C$ 48 from the controller (FIG. 1) and has an output node 34a having an output impedance. The output node 34a of the low impedance driver circuit portion 34 is coupled to the output node 30a of the high impedance driver circuit portion 30 and the FET control signal 26 is provided at the junction of output nodes 30a, 34a, as shown. The output impedance of the low impedance driver circuit portion 34 is lower than the output impedance of the high impedance driver circuit portion and may be on the order of tens of kilo ohms for example.

The illustrative low impedance driver circuit portion 34 includes a pre-driver circuit having series-coupled FETs 104, 108, each of which has a gate terminal coupled to the gate terminal of a respective FET 80, 82, as shown, to mirror the current through FETs 80, 82. More particularly, FETs 104, 108 may be a scaled version of FETs 80, 82, respectively. [CORRECT?] The junction 110 between FETs 104, 108 is coupled to a further transistor and here, to an npn transistor 114 in an emitter follower configuration. The transistor 114 has a base 114a coupled to junction 110, a collector coupled to the voltage regulator 44 and an emitter 114c at which the low impedance driver circuit portion output node 34a is provided.

Use of the bipolar transistor 114 provides the low impedance driver circuit portion 34 with a lower output impedance than the high impedance driver circuit portion 30. However, it will be appreciated that other devices may be used in place of transistor 114 to still provide an impedance that is lower than the impedance at the high impedance output node 30a. As one example, the transistor 14 could be implemented with an n-channel MOSFET.

The low impedance driver circuit portion 34 additionally includes a switch 120 and a switch 126, which in the illustrated embodiment are shown as single pole, double throw switches. Under the control of the enable signal $V_C$ 48, switch 120 can be in a first position (as represented by the solid line) in which the gate of FET 80 is coupled to the gate of pre-driver FET 104 or in a second position (as represented by the dotted line) in which the gate of FET 80 is de-coupled from the gate of FET 104 and the gate of FET 104 is pulled to $V_{REG}$ through a pull-up resistor 122. Similarly, under the control of the enable signal $V_C$ 48, switch 126 can be in a first position (as represented by the solid line) in which the gate of FET 82 is coupled to the gate of pre-driver FET 108 or in a second position (as represented by the dotted line) in which the gate of FET 82 is de-coupled from the gate of FET 108 and the gate of FET 108 is pulled to ground through pull-down resistor 128.

Figure 3:
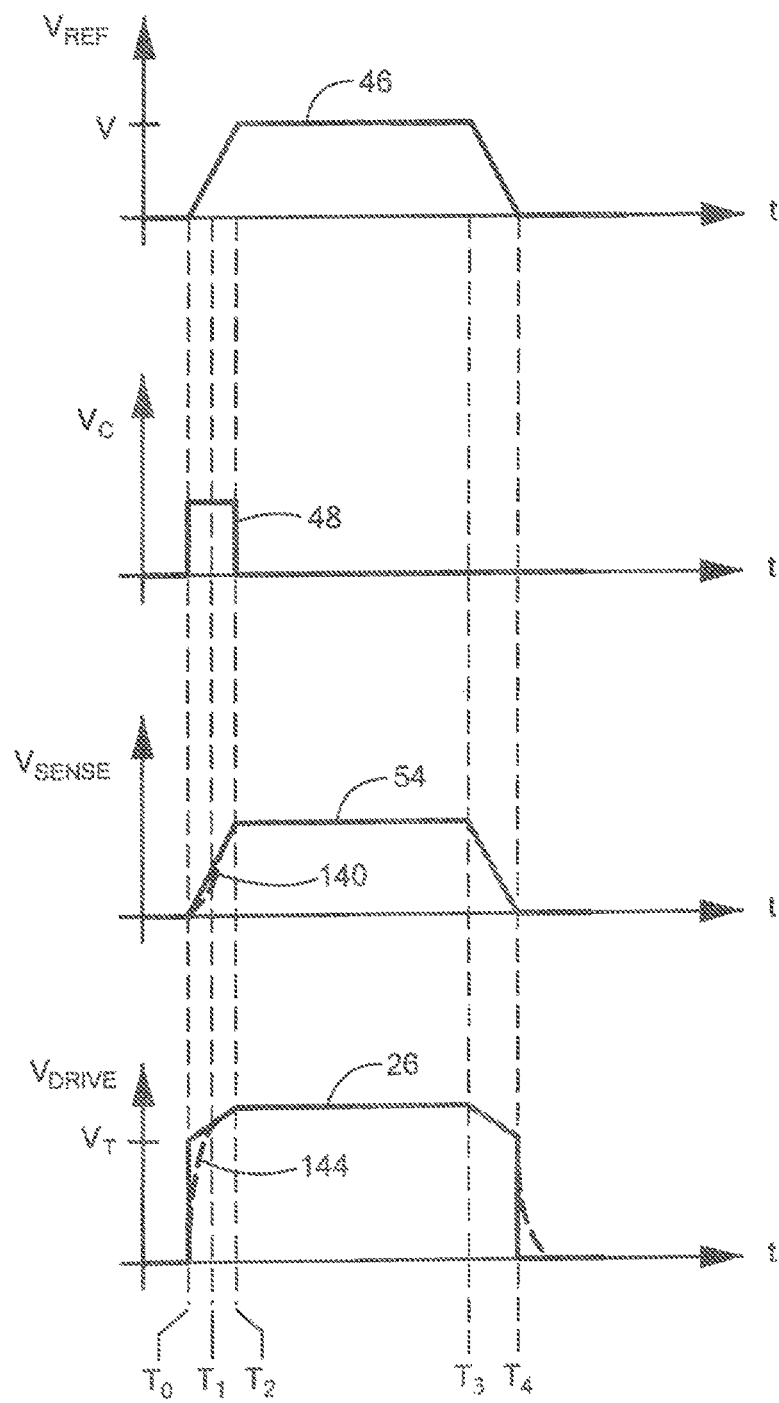
FIG. 3 shows illustrative waveforms associated with the driver circuit of FIGS. 1 and 2.

Referring also to the illustrative waveforms of FIG. 3, the reference signal 46 provided by the controller 40 (FIG. 1) is shown. The reference signal 46 represents the desired turn on and turn off characteristics of the FET 18. The illustrative reference signal 46 ramps up starting at a time $T_0$, here in a generally linear fashion, until it reaches a predetermined voltage level V at a time $T_2$. Time $T_0$ coincides with the controller 40 commanding that the FET 18 be turned on. This time interval from $T_0$ to $T_2$ can be referred to as a slew time interval. The reference signal 46 remains at a substantially constant voltage level V until a time $T_3$, when the signal ramps down, also in a generally linear fashion, until a time $T_4$. The ramping up and ramping down of the reference signal may follow the same general slope, or alternatively may have different slopes to suit application requirements.

The low impedance enable signal $V_C$ 48 is high to "enable" the low impedance driver circuit portion 34 between times $T_0$ and $T_1$ by causing the switch 120 to coupled the gate of FET 104 to the gate of FET 80 and the gate of FET 108 to the gate of FET 82. The low impedance enable signal $V_C$ is low at other times to "disable" or decouple the low impedance driver circuit portion 34 from the transistor 18 by causing switch 120 to couple the gate of FET 104 to pull-up resistor 122 and causing switch 126 to couple the gate of FET 108 to pull-down resistor 128, thereby turning off the pre-driver circuit 100 and transistor 114.

In operation, as the $V_{REF}$ signal 46 ramps up, the current through FETs 80 and 82 causes the voltage at the output node 30a to move towards a level necessary to have the $V_{SENSE}$ signal 54 track the $V_{REF}$ signal 46. Also as the $V_{REF}$ signal 46 ramps up, current flows through low impedance driver circuit portion 34 pre-driver circuit 100 (and specifically through FETs 104 and 108). The junction 110 between FETs 104 and 108 can ramp up more quickly than the junction between FETs 80 and 82 because unlike the latter, the junction between FETs 80 and 82 is not coupled to the gate to source capacitance of FET 18. The current flow through the pre-driver circuit 100 causes the transistor 114 to enter the forward active region. When transistor 114 conducts, the output impedance of the low impedance driver circuit portion 34 affects the slew rate of the FET control signal 26 by lowering the overall output impedance of the driver circuit 14. In particular, because the output node 34a of the low impedance driver circuit portion 34 has relatively low impedance, the effect of transistor 114 turning on is to "boost" or to more quickly ramp up the voltage of the control signal 26. If the low impedance driver circuit portion 34 were not present, then the control signal 26 would ramp up more slowly, as shown by dotted line 144 for example.

Once the control signal $V_{DRIVE}$ 26 has ramped up to a level sufficient to cause the FET 18 to be turned on according to the desired characteristic represented by the reference signal 46, the low impedance driver circuit portion 34 is disabled by turning off the FETs 104, 108, which in turn turns off the transistor 114. More particularly, here at a time $T_1$, the low impedance enable signal $V_C$ 48 transitions, toggling switches 120 and 126 to cause the gate of transistor 104 to be pulled up through pull-up resistor 122 and the gate of transistor 108 to be pulled to ground through pull-down resistor 128.

With the above-described arrangement, the slew rate of the control signal 26 is established by both the high impedance driver circuit portion 30 and the low impedance driver circuit portion 34 during a first portion of the slew time interval (e.g., between times $T_0$ and $T_1$), causing the feedback signal $V_{SENSE}$ 54 to closely track the reference voltage 46, as is desired. If the low impedance circuit portion 34 were not present, due to circuit limitations (e.g., the gate to source capacitance of the FET 18), the feedback signal $V_{SENSE}$ 54 might ramp up at a slower rate than desired, as shown by the dotted line 140 for example.

The slew rate of the control signal 26 is not established by the low impedance driver circuit portion 34 during a second portion of the slew time interval, following the first portion of the slew time interval (e.g., between times $T_1$ and $T_2$). As one example, the first portion of the slew time interval may be on the order of twenty-five microseconds and the second portion of the slew time interval may be on the order of 55 microseconds. It will be appreciated however that the length of the first and second portions of the slew time interval can be selected to optimize tradeoffs between having the sense voltage $V_{SENSE}$ 54 closely track the reference voltage $V_{REF}$ 46 without causing loop stability concerns.

The particular time at which the low impedance driver circuit portion 34 is disabled can be a relatively short time after the start of the slew time interval rather than being near or coinciding with when the FET actually conducts (i.e., when the conduction threshold is reached) and can be selected by empirical methods. The reason for enabling the low impedance driver circuit portion 34 for as brief a time as required to achieve the desired FET turn on characteristic is that the lower impedance at its output node 34a can cause instability in the circuit control loop. Alternatively however, it will be appreciated that the low impedance driver circuit portion 34 can be disabled at a later time during the slew time interval or can even be enabled during the entire slew time interval in certain applications.

In some applications, the slew rate at which the FET 18 is turned off is less critical than the rate at which the FET is turned on, such as because the FET gate voltage does not have to change as significantly to turn off the FET as it does to turn on the FET. For this reason, the low impedance driver circuit 34 may be enabled only during at least a portion of the slew time interval between times $T_0$ and $T_1$. In this scenario, the control signal 26 is ramped up at a slew rate established by the high output impedance at output node 30a and the lower impedance at output node 34a and the control signal is ramped down at a slew rate that is not established by the lower output impedance at output node 34a.

All references cited herein are hereby incorporated herein by reference in their entirety.

Having described preferred embodiments, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A driver circuit for driving a transistor having a control terminal responsive to a control signal having a slew rate during a slew time interval, comprising:
    a first driver circuit portion having a first output node coupled to the control terminal of the transistor, a first output impedance, a first input responsive to a feedback signal, a second input responsive to a reference signal, and configured to generate an output signal at the first output node, wherein the first driver circuit portion further comprises a differential amplifier comprising the first input and the second input and a current mirror coupled to an output of the differential amplifier; and
    a second driver circuit portion having a second output node coupled to the control terminal of the transistor and having a second output impedance, lower than the first output impedance, wherein the slew rate of the control signal is established by at least one of the first driver circuit portion and the second driver circuit portion, wherein the second driver circuit portion comprises a pre-driver circuit coupled to the first driver circuit portion and a transistor having a control terminal and an output terminal, wherein the control terminal of the transistor is responsive to the pre-driver circuit and the output terminal of the transistor provides the second output node, wherein the second driver circuit portion further comprises a switch configured to be in a first position to enable the pre-driver circuit or in a second position to disable the pre-driver circuit portion, wherein the slew rate of the control signal is established by the first driver circuit portion and the second driver circuit portion during a first portion of the slew time interval when the switch is in the first position and wherein the slew rate of the control signal is not established by the second driver circuit portion during a second portion of the slew time interval, following the first portion of the slew time interval when the switch is in the second position.

2. The driver circuit of claim 1 wherein the differential amplifier comprises an operational transconductance amplifier.

3. The driver circuit of claim 1 wherein the transistor is a bipolar transistor, the control terminal comprises a base terminal and the output terminal comprises an emitter terminal.

4. An LED driver circuit comprising:
    a switching device for driving an LED load, the switching device having a control terminal and a conduction threshold which, when crossed by a control signal coupled to the control terminal, causes the switching device to conduct; and
    a driver circuit for generating the control signal, wherein the control signal has a slew rate during a slew time interval, comprising:
        a first driver circuit portion having a first output node coupled to the control terminal of the transistor, a first output impedance, a first input responsive to a feedback signal, a second input responsive to a reference signal, and configured to generate an output signal at the first output node, wherein the first driver circuit portion further comprises a differential amplifier comprising the first input and the second input and a current mirror coupled to an output of the differential amplifier; and
        a second driver circuit portion having a second output node coupled to the control terminal of the transistor and having a second output impedance, lower than the first impedance, wherein the slew rate of the control signal is established by at least one of the first driver circuit portion and the second driver circuit portion, wherein the second driver circuit portion comprises a pre-driver circuit coupled to the first driver circuit portion and a transistor having a control terminal and an output terminal, wherein the control terminal of the transistor is responsive to the pre-driver circuit and the output terminal of the transistor provides the second output node, wherein the second driver circuit portion further comprises a switch configured to be in a first position to enable the pre-driver circuit or in a second position to disable the pre-driver circuit portion, wherein the slew rate of the control signal is established by the first driver circuit portion and the second driver circuit portion during a first portion of the slew time interval when the switch is in the first position and wherein the slew rate of the control signal is not established by the second driver circuit portion during a second portion of the slew time interval, following the first portion of the slew time interval when the switch is in the second position.

* * * * *